United States Patent
Dao

(10) Patent No.: US 10,412,151 B2
(45) Date of Patent: Sep. 10, 2019

(54) METHOD AND SYSTEM FOR ON-DEMAND FILE REPAIR

(71) Applicant: Huawei Technologies Co., Ltd., Shenzhen (CN)

(72) Inventor: Ngoc-Dung Dao, Ottawa (CA)

(73) Assignee: Huawei Technologies Co., Ltd., Shenzhen (CN)

(*) Notice: Subject to any disclaimer, the term of this patent is extended or adjusted under 35 U.S.C. 154(b) by 37 days.

(21) Appl. No.: 14/855,181

(22) Filed: Sep. 15, 2015

(65) Prior Publication Data

US 2016/0218831 A1 Jul. 28, 2016

Related U.S. Application Data

(60) Provisional application No. 62/107,819, filed on Jan. 26, 2015.

(51) Int. Cl.
*H04L 29/08* (2006.01)
*H03M 13/37* (2006.01)
*H04L 1/18* (2006.01)
*H04L 12/26* (2006.01)

(52) U.S. Cl.
CPC ........ *H04L 67/06* (2013.01); *H03M 13/3761* (2013.01); *H04L 1/1819* (2013.01); *H04L 1/1829* (2013.01); *H04L 1/1848* (2013.01); *H04L 1/1896* (2013.01); *H04L 43/0829* (2013.01)

(58) Field of Classification Search
CPC ..... H04L 67/06; H04L 1/1819; H04L 1/1896; H04L 1/1829; H04L 1/0057; H04L 43/0829; H03M 13/3761
See application file for complete search history.

(56) References Cited

U.S. PATENT DOCUMENTS 4,908,828 A * 3/1990 Tikalsky ............... H04L 1/0083
370/389
5,416,785 A * 5/1995 Nishii ................ H04N 1/32619
358/404

(Continued)

FOREIGN PATENT DOCUMENTS

CN 101667904 A 3/2010
CN 102694636 A 9/2012

(Continued)

OTHER PUBLICATIONS

RFC 3926, Section 3.4.1, 3.4.2, Oct. 2004, "FLUTE—File Delivery over Unidirectional Transport".*

(Continued)

*Primary Examiner* — Cynthia Britt
*Assistant Examiner* — Sazzad Hossain
(74) *Attorney, Agent, or Firm* — Slater Matsil, LLP

(57) ABSTRACT

Disclosed is system and method to implement an on-demand file repair protocol. In the protocol, a traffic source sends all data packets of a data file to a traffic sink. The traffic source then sends to the traffic sink an indication that the sending of the all data packets is complete. If data packets are missing, a request is received from the traffic sink for retransmission of missing packets. The traffic source then sends fountain codes of the missing packets to the traffic sink.

23 Claims, 3 Drawing Sheets

(56) References Cited

U.S. PATENT DOCUMENTS

| | | | | |
|---|---|---|---|---|
| 6,073,180 | A * | 6/2000 | Onoda | H04L 67/06 709/230 |
| 7,010,727 | B1 * | 3/2006 | Stucker | H04Q 3/0025 709/247 |
| 7,877,660 | B2 * | 1/2011 | Ver Steeg | H04L 1/1819 714/751 |
| 7,924,761 | B1 * | 4/2011 | Stevens | H03M 13/3761 370/315 |
| 2004/0095964 | A1 | 5/2004 | Meylan et al. | |
| 2004/0228358 | A1 | 11/2004 | Beshai et al. | |
| 2005/0163046 | A1 | 7/2005 | Koponen et al. | |
| 2006/0227712 | A1 | 10/2006 | Cheng et al. | |
| 2007/0223620 | A1 | 9/2007 | Kalhan et al. | |
| 2008/0022190 | A1 | 1/2008 | Ver Steeg | |
| 2008/0028280 | A1 | 1/2008 | Ver Steeg | |
| 2008/0075004 | A1 * | 3/2008 | Mishima | H04N 21/4305 370/230 |
| 2009/0240701 | A1 | 9/2009 | Gautier et al. | |
| 2011/0228714 | A1 | 9/2011 | Akbari et al. | |
| 2012/0054583 | A1 * | 3/2012 | Park | H03M 13/3761 714/776 |
| 2012/0188934 | A1 * | 7/2012 | Liu | H04L 12/1863 370/312 |
| 2013/0114443 | A1 | 5/2013 | Van Zijst | |
| 2014/0143626 | A1 | 5/2014 | Mull et al. | |

FOREIGN PATENT DOCUMENTS

| | | |
|---|---|---|
| CN | 103078707 A | 5/2013 |
| CN | 103973402 A | 8/2014 |
| JP | 2001218276 A | 8/2001 |
| JP | 2007522704 A | 8/2007 |
| JP | 2008092213 A | 4/2008 |
| JP | 2009152864 A | 7/2009 |
| JP | 2013162199 A | 8/2013 |
| KR | 20080113075 A | 12/2008 |
| KR | 101481768 B1 | 1/2015 |
| WO | 2015020372 A1 | 2/2015 |

OTHER PUBLICATIONS

Adamson, B., et al., "NACK-Oriented Reliable Multicast (NORM) Transport Protocol," Network Working Group, RFC 5740, Nov. 2009, pp. 1-95.

Mathis, M., et al., "TCP Selective Acknowledgment Options," Network Working Group, RFC 2018, Oct. 1996, pp. 1-13.

Paila, T., et al., "FLUTE-File Delivery over Unidirectional Transport," Internet Engineering Task Force (IETF), RFC 6726, Nov. 2012, pp. 1-47.

Sawa, K et al., "A Study of APpricatable with Reliable Transmission Control to Wireless Access System", The Institute of Electronics, Information and Communications Engineers, IEICE Technical Report, SR2008-48(Nov. 2008), Nov. 2006, 6 Pages, vol. 106, No. 395.

* cited by examiner

METHOD AND SYSTEM FOR ON-DEMAND FILE REPAIR

PRIORITY CLAIM AND CROSS-REFERENCE

This application claims the benefit of the following provisionally filed U.S. patent application: application Ser. No. 62/107,819, filed Jan. 26, 2015, and entitled "Method and System for an On-Demand File Repair Protocol," which application is hereby incorporated herein by reference.

TECHNICAL FIELD

The present invention relates to a method and system for file repair, and, in particular embodiments, to a method and system for on-demand file repair.

BACKGROUND

Data transmission can be unreliable. For larger files, it is almost guaranteed that some data will be lost. This problem is particularly acute in wireless transmission. To address this problem, packet transmission was developed. In packet transmission, files are broken into small packets that are transmitted separately. This type of system is used on the Internet. Transmission Control Protocol (TCP) includes specific formatting for packets that includes error checking and the necessary information to assemble the packets into the original file. When a packet is received, the error control information is used to determine if the packet has been corrupted. An acknowledgement message (ACK) is then sent from the recipient (sink) to the sender (source) indicating if the packet was received intact. If not, the source sends it again. This process is highly effective and remains the backbone of the Internet. Although more sophisticated protocols have replaced the original TCP in many cases, this fundamental process remains.

However, for bandwidth constrained applications, TCP and TCP-like protocols require too much overhead. This is particularly true in wireless networks like cellular communications. Packet transmission in mobility is subject to high packet loss ratio. Even with the best wireless link, data losses can be high and thus the network can be choked with error correction traffic. Therefore, TCP and similar protocols are not as effective in these environments.

SUMMARY

One embodiment of the present disclosure includes a method for on-demand file repair. In a first step, all data packets of a data file are a traffic source to a traffic sink. Then, an indication that the sending of the all data packets is complete is sent from the traffic source to the traffic sink. A request is then received from the traffic sink for retransmission of missing packets from the all data packets. Fountain codes of the missing packets are then sent to the traffic sink.

In another embodiment of the present disclosure, a method for on-demand file repair is shown. The method includes sending, by a traffic source, all data packets of a data file to a traffic sink. The traffic source then sends to the traffic sink an indication that the sending of all data packets is complete. The traffic sink then waits for a calculated period of time after receiving the indication. A request from the traffic sink is then received for retransmission of missing packets from the all data packets. The traffic source sends a series of fountain codes of the missing packets to the traffic sink until the traffic sink receives enough fountain codes to decode the missing packets.

Another embodiment of the present disclosure is a network device providing on-demand file repair. The network device includes a processor and a non-transitory computer readable storage medium storing programming for execution by the processor. The programming includes instructions to send, by a traffic source, all data packets of a data file to a traffic sink. A further instruction causes the device to send to the traffic sink an indication that the sending of the all data packets is complete. The next instruction causes the device to receive a request from the traffic sink for retransmission of missing packets from all data packets. Another instruction causes the device to send fountain codes of the missing packets to the traffic sink.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The structure, manufacture and use of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Current file delivery protocols have pros and cons. Transfer control protocol (TCP) requires cumulative acknowledgement (ACK) for received packets. In selective ACK (SACK), the receiver sends an ACK for each received data segment, and the source sends uncoded missing packets. With user datagram protocol (UDP), there is no feedback channel for packet retransmission. With reliable UDP, there is a feedback channel for re-sending missing packets. The issue is that there is no rate control and network support mechanism in mobility.

Fountain coding (FC) is an effective way to compensate for packet losses when packets are sent through multiple network interfaces with different packet loss probability. The first fountain code was proposed by Luby (U.S. Pat. No. 6,307,487, which is hereby incorporated in this specification by reference). An example of a highly efficient fountain code is described in Shokrollahi et al. (U.S. Pat. No. 7,068,729, which is hereby incorporated in the specification by reference). Fountain codes have the property that a nearly limitless number of symbols may be generated by the encoding process. However, they also have the property that, if the original file (symbol) is k packets, the original symbol can be decoded with any k+x (x can be any number greater than 0) encoded packets, no matter the order. In current use, FC is used at the application level (AL-FEC, application level forward error correction) and the transmitted file is encoded at the source.

Application-layer coding protocols (based on fountain codes) include file delivery over unidirectional transport (FLUTE), 3rd Generation Partnership Project (3GPP) Multimedia Broadcast Multicast Service (MBMS), and NACK-oriented reliable multicast (NORM). FLUTE is a UDP-based multicast with fixed application-layer coding redundancy. 3GPP MBMS system is based on FLUTE with file correction protocol. With NORM, there are multicast applications, the big file is segmented, and forward error correction (FEC) repair packets are produced for each segment.

Figure 1:
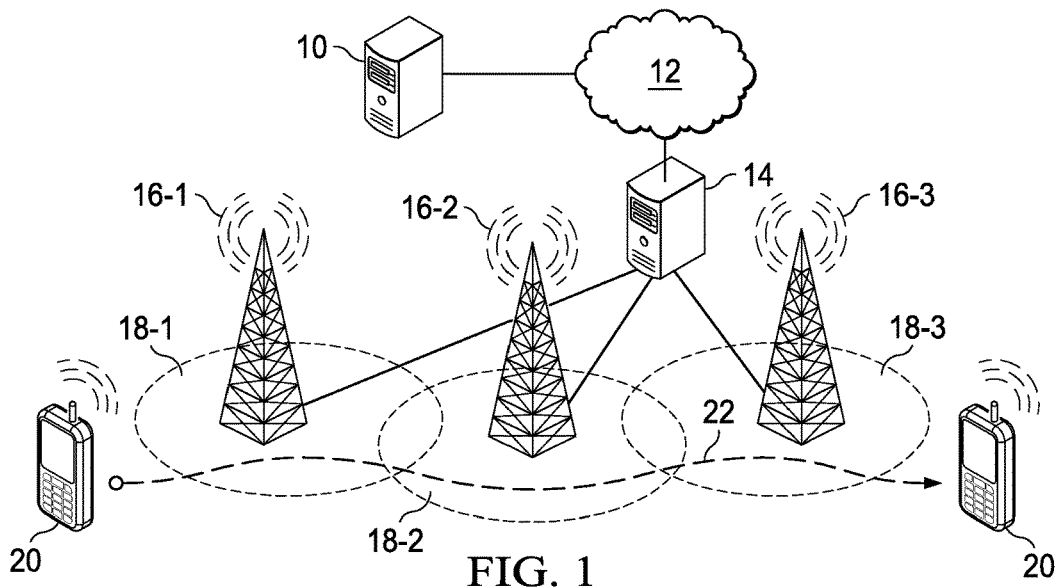
FIG. 1 illustrates a system model for application of one embodiment of the present disclosure.

FIG. 1 is illustrates a wireless network in which one embodiments may be implemented. Server 10 provides the data to be delivered via the Internet 12 to virtual user-specific serving gateway (v-u-SGW) 14. V-u-SGW 14 is part of a local cellular network that includes cell towers 16-1, 16-2 and 16-3. Of course, the cellular network would include other management devices and many more cell towers. The network of FIG. 1 is simplified for clarity. V-u-SGW 14 sends the data to cell towers 16-1, 16-2 and 16-3, which transmit them in their coverage areas (18-1, 18-2 and 18-3, respectively). User equipment 20 is, in this example, a cell phone. Being a mobile device, it is assumed that it will travel along a path such as path 22 that will bridge several cells. This provides an environment where the loss of data in transmission is highly likely.

Embodiments of the present disclosure provide an on-demand file repair solution. In various embodiments, the data file is not segmented, and FC is applied to only missing packets. Embodiments include an on-demand file repair protocol for unicast communications. In various embodiments, all original packets are sent to the receiver. The receiver reports missing packets or data segments (or alternatively received packets or data segments), and the sender encodes the missing packets or data segments and sends coded packets until the receiver can decode the missing packets. The traffic source and sink notify each other of the method used to report missing or received data, and the method used to report data packet numbers or data segments (e.g. start and end bytes).

In an embodiment, the v-u-SGW collects data packets of a flow. The data packets are sent over multiple paths to multiple serving radio nodes. Radio nodes perform independent packet scheduling and transmit the data packets to the receiver until all of the packets have been transmitted. The data rates on multiple paths of multiple flows are jointly optimized by the traffic engineering (TE) optimizer, taking into account the capacity of wired and wireless links. After waiting a sufficient time after receiving an end_of_file control message, the mobile unit returns which data packets are missing. The v-u-SGW then fountain codes all of the missing packets and begins transmitting fountain codes until the mobile unit indicates that it has received enough codes to decode the missing packets.

Advantages of some embodiments include lower encoding and decoding delay and simplification of the file transmission protocol. Another benefit includes avoiding ACK packets of TCP, because TCP performs poorly in mobile networks. A further benefit includes avoiding coding/decoding complexity of FLUTE or multimedia broadcast multicast service (MBMS), which have been designed for multicast.

Various embodiments include unicast data communication protocols and messages between sender and receiver. Various embodiments can be used for unicast applications, including web browsing, email, online video streaming, etc.

Figure 2:
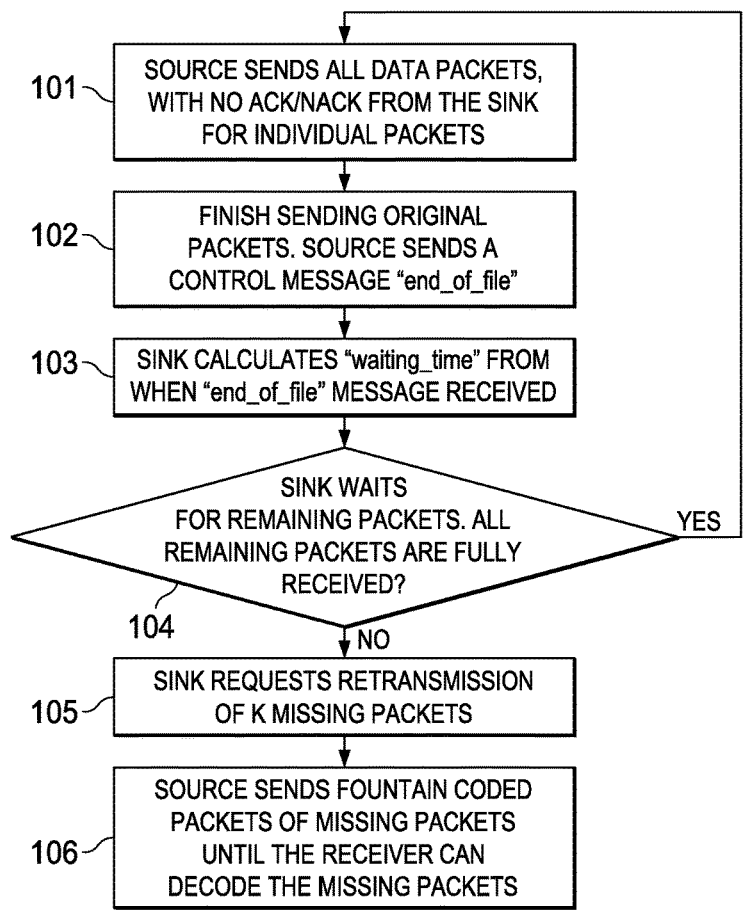
FIG. 2 is a flow chart illustrating a process that is one embodiment of the present disclosure.

An embodiment of an on-demand file repair protocol is presented in FIG. 2 as follows. In step 101, the traffic source sends all data packets, with no ACK/NACK from the sink for individual packets. Step 102 includes finishing sending the original packets. When all packets in the file have been sent, the source sends a control message "end_of_file" (EOF). In step 103, the sink calculates a "waiting_time" after receiving the "end_of_file" message. The waiting time is based on the average received data rate and the remaining unreceived data. The data rate could be determined for the data rate of the last X seconds of transmission or from the start of the session. In step 104, the sink waits for remaining packets. If all remaining packets are fully received before the end of "waiting_time," the session finishes. Otherwise, in step 105, the sink requests retransmission of missing packets or missing data segments, if any. The packet number format is much shorter than the conventional 16-bit identification (ID) of Internet protocol version 4 (IPv4) or 32-bit ID of IPv6. Missing packet numbers or data segments are compressed and sent in the payload of one protocol control packet. In step 106, the source sends fountain codes of all of the missing packets until the receiver can decode the missing packets. In another embodiment, the number of fountain codes transmitted is limited to a subset of possible fountain codes necessary to decode the missing packets.

Figure 3:
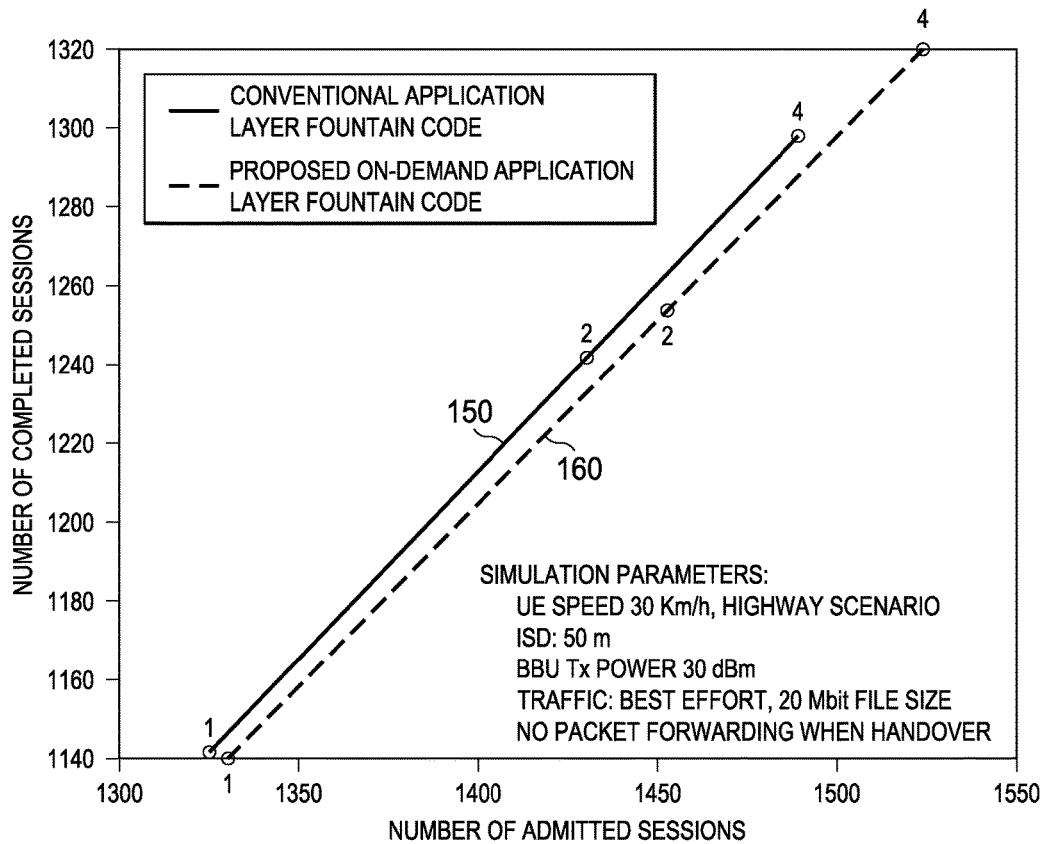
FIG. 3 illustrates performance of file repair protocols.

FIG. 3 illustrates the simulated performance of an embodiment on-demand file repair protocol compared to a conventional application layer fountain code. In an embodiment, the protocol is within 1% of the performance of the conventional application-layer coding protocol. Line 150 of the graph of FIG. 3 shows performance of described embodiments versus line 160 using application layer applied fountain codes.

Figure 4:
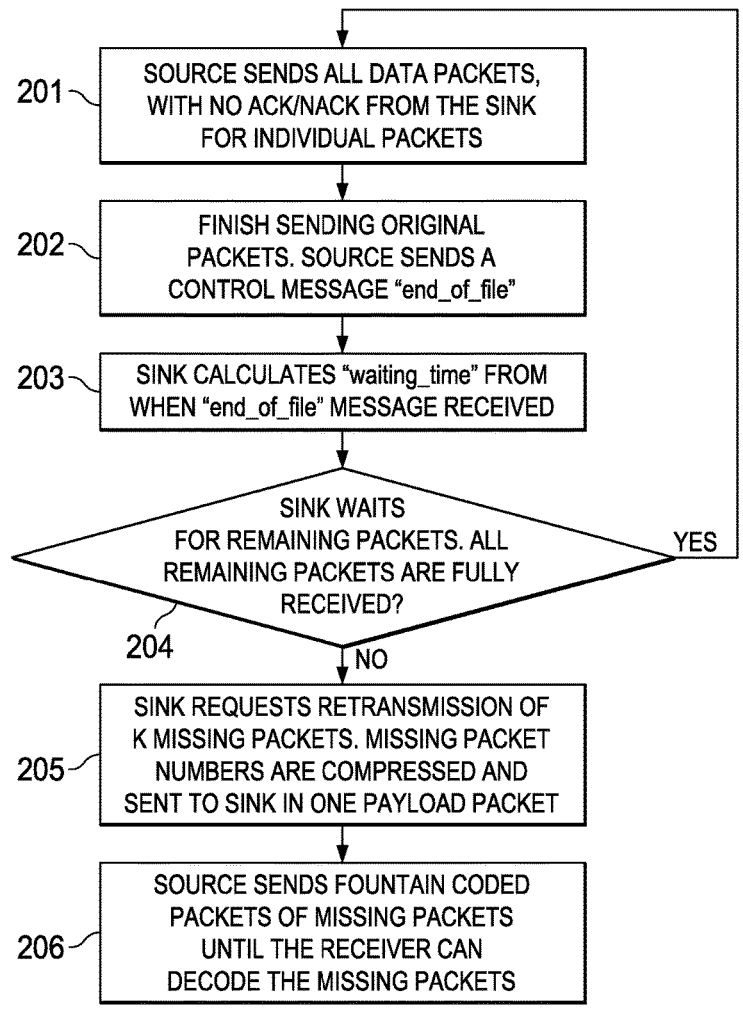
FIG. 4 is a flow chart illustrating a process that is another embodiment of the present disclosure.

Another embodiment of an on-demand file repair protocol is shown in FIG. 4. In step 201, the traffic source sends all data packets, with no ACK/NACK from the sink for individual packets. The traffic sink always keeps in the received buffer the last received N packets (Set A) to keep the buffer at low level (reducing complexity). The traffic sink sends other packets to the application layer. Step 202 includes finishing sending original packets. When the file is complete, the source sends a control message "end_of_file." The traffic source (or virtual UE gateway) keeps copies of all sent packets. In step 203, the sink calculates "waiting_time" when receiving an "end_of_file" message, based on the average received data rate and remaining data. The average data rate could be in the last X seconds or from the start of the session. The sink could also wait a predefined time period, which could be, e.g., predefined or a parameter in the session.

In step 204, the sink waits for remaining packets. If all remaining packets are fully received before the end of "waiting_time," the session finishes. Otherwise, in step 205, the traffic sink requests retransmission of K missing packets. Because the remaining packets should include less data, the packet number format may be the 16-bit ID of IPv4 or 32-bit ID of IPv6 shorter than the conventional, or another shorter format may be used. Missing packet numbers are compressed and sent in payload of one protocol control packet. In step 206, the source sends fountain coded packets of missing packets until the receiver can decode the missing packets. Fountain coding requires a minimum subset of possible fountain coded packets N for efficient coding. If K>N, the source applies FC to K missing packets. If K<=N, the source applies FC to K missing packets and the (N-K) last received packets. This will ensure that a significant amount of redundant packets will be generated from a significantly large number of packets if the number of missing packets is small. In an embodiment, a threshold could also be applied so that the fountain code transmission is only used for the missing packets if there are enough packets to justify it.

Figure 5:
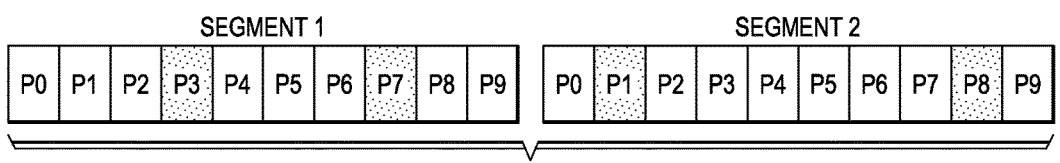
FIG. 5 illustrates a file split into two segments with NORM protocol.

Embodiments of the present disclosure apply fountain coding to missing packets only, i.e., only coded packets for missing packets. Comparatively, NORM or FLUTE are multicast, and include FC for the whole data segment, including received and missing packets. For example, with NORM, a file is split in two segments as illustrated in FIG. 5. If there are missing packets in each segment, the NORM sender sends coded data for the erroneous segment.

The encoding and decoding computational complexity of fountain codes is only linear in the number of data symbols. Nevertheless, additional complexity such as buffer size at the source and sink can be taken into account. The NORM and MBMS file delivery protocols (illustrated in FIG. 5) provide a measure to reduce the complexity by splitting large files into smaller segments. Fountain coding is applied to data segments with manageable encoding/decoding complexity and memory size of the user. This procedure is efficient in large-scaled multicast file distributions, where many users may lose different packets of the same data segments. In the unicast scenario, a user may lose a few packets in different segments. Then the error correction process is applied for each segment, which may take a longer time to correct errors in all segments.

The disclosed embodiments provide a more efficient error correction procedure, namely on-demand fountain coding (OD-FC), which is to just apply fountain coding for missing data packets only. The traffic sink reports missing packets upon receiving a certain number of packets. The source and sink then may remove received packets from transmit and receive buffers, respectively, to save memory. If the number of missing packets is small, it may be impossible to generate many coded packets. One solution is to encode the missing packets and some lastly-received packets so that the total number of packets entering the FC encoder will be enough to generate a large amount of coded packets. The performance of OD-FC protocol is verified by extensive simulations. The OD-FC protocol performs as good as the conventional FC-MP (fountain coded multi-path) protocol, while the encoding/decoding complexity can be reduced extensively.

Figure 6:
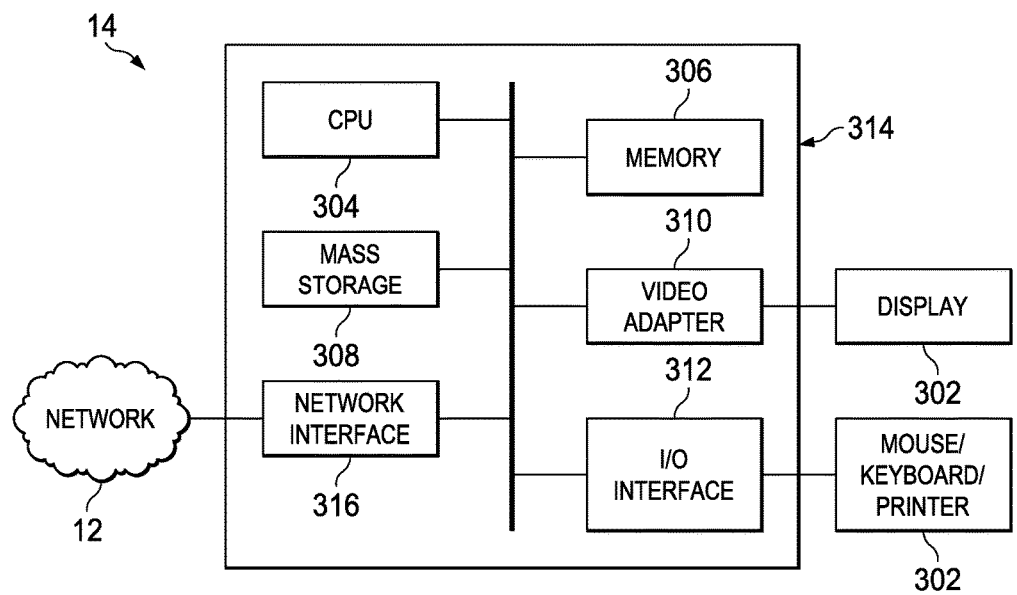
FIG. 6 illustrates a computing platform that may be used for implementing, for example, the devices and methods described herein, in accordance with an embodiment.

FIG. 6 is a block diagram of a processing system such as v-u-SGW 14 of FIG. 1 that may be used for implementing the devices and methods disclosed herein. Specific devices may utilize all of the components shown, or only a subset of the components and levels of integration may vary from device to device. Furthermore, a device may contain multiple instances of a component, such as multiple processing units, processors, memories, transmitters, receivers, etc. The processing system may comprise a processing unit equipped with one or more input/output devices 302, such as a speaker, microphone, mouse, touchscreen, keypad, keyboard, printer, display, and the like. The processing unit may include a central processing unit (CPU) 304, memory 306, a mass storage device 308, a video adapter 310, and an I/O interface 312 connected to a bus 314.

The bus 314 may be one or more of any type of several bus architectures including a memory bus or memory controller, a peripheral bus, video bus, or the like. The CPU 304 may comprise any type of electronic data processor. The memory 306 may comprise any type of non-transitory system memory such as static random access memory (SRAM), dynamic random access memory (DRAM), synchronous DRAM (SDRAM), read-only memory (ROM), a combination thereof, or the like. In an embodiment, the memory may include ROM for use at boot-up, and DRAM for program and data storage for use while executing programs.

The mass storage device 308 may comprise any type of non-transitory storage device configured to store data, programs, and other information and to make the data, programs, and other information accessible via the bus. The mass storage device 308 may comprise, for example, one or more of a solid state drive, hard disk drive, a magnetic disk drive, an optical disk drive, or the like.

The video adapter 310 and the I/O interface 312 provide interfaces to couple external input and output devices to the processing unit. As illustrated, examples of input and output devices include the display coupled to the video adapter and the mouse/keyboard/printer coupled to the I/O interface. Other devices may be coupled to the processing unit, and additional or fewer interface cards may be utilized. For example, a serial interface such as Universal Serial Bus (USB) (not shown) may be used to provide an interface for a printer.

The processing unit also includes one or more network interfaces 316, which may comprise wired links, such as an Ethernet cable or the like, and/or wireless links to access nodes or different networks. The network interface 316 allows the processing unit to communicate with remote units via the networks. For example, the network interface may provide wireless communication via one or more transmitters/transmit antennas and one or more receivers/receive antennas. In an embodiment, the processing unit is coupled to a local-area network or a wide-area network 12 for data processing and communications with remote devices, such as other processing units, the Internet, remote storage facilities, or the like.

The system of FIG. 6 may be used to implement, for example, a network traffic sink providing on-demand file repair. The network traffic sink may include a processor like CPU 304 and a non-transitory computer readable storage medium such as mass storage device 308 storing programming for execution by the processor. The programming may include instructions to receiving data packets of a data file from a traffic source; receiving from the traffic source an indication that the sending of the data packets is complete; sending a request to the traffic source for retransmission of missing packets from the data packets; and receiving fountain codes of the missing packets from the traffic source. The network traffic sink may include instructions for sending the request for retransmission for a period of time after receiving the indication that the sending of the data packets is complete. Also, the period of time may be calculated from a rate at which the data packets are received by the traffic sink and an amount of remaining data. In an additional embodiment, the request for retransmission is delayed for a period of time after sending the indication that the sending of the all data packets is complete. In further embodiment, the receiving of fountain codes includes receiving a subset of possible fountain codes. In a further embodiment, the subset is a minimum number of fountain codes necessary to decode all of the missing packets. In a further embodiment, the network traffic sink is part of a radio network and the traffic sink is a mobile terminal. In a further embodiment, the radio network is a cellular radio network.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for on-demand file repair comprising:
   sending, by a traffic source, all of original data packets of a data file to a traffic sink without encoding any of the original data packets sent by the traffic source;
   sending, by the traffic source, an indication to the traffic sink, wherein the indication indicates that all of the original data packets of the data file have been sent;
   receiving, by the traffic source, a request from the traffic sink for retransmission of missing original data packets of all the original data packets of the data file, the request comprising information related to the missing original data packets;
   after receiving the request, applying, by the traffic source, fountain coding to only the missing original data packets to generate fountain coded packets for the missing original data packets; and
   sending, by the traffic source, the fountain coded packets for the missing original data packets to the traffic sink.

2. The method of claim 1 wherein the request for retransmission is received a period of time after sending the indication that the sending of all of the original data packets is complete.

3. The method of claim 1 wherein the sending the fountain coded packets comprises sending a subset of possible fountain coded packets.

4. The method of claim 3 wherein the subset is a minimum number of fountain coded packets necessary to decode all of the missing original data packets.

5. The method of claim 1 wherein:
   the sending the fountain coded packets for the missing original data packets comprises sending a series of fountain coded packets of the missing original data packets until the traffic sink receives enough fountain coded packets to decode the missing original data packets.

6. The method of claim 5 wherein the request from the traffic sink for the retransmission of missing original data packets is a single control packet comprising a payload containing packet numbers of the missing original data packets.

7. The method of claim 6 wherein the packet numbers of the missing original data packets included in the payload are compressed.

8. A method for on-demand file repair comprising:
   receiving, by a traffic sink, original data packets of a data file sent by a traffic source, wherein none of the received original data packets are encoded by the traffic source;
   receiving, by the traffic sink, an indication from the traffic source, wherein the indication indicates that all the original data packets of the data file have been sent;
   after receiving the indication, determining whether all the original data packets of the data file have been received before expiry of a predetermined time period;
   after determining that all the original data packets of the data file have not been received before the expiry of the predetermined time period, sending, by the traffic sink, a request for retransmission of missing original data packets from all the original data packets of the data file to the traffic source, the request comprising information related to the missing original data packets for the traffic source to apply fountain coding to the missing original data packets to generate fountain coded packets for only the missing original data packets and transmit the fountain coded packets for the missing original data packets to the traffic sink; and
   receiving, by the traffic sink, the fountain coded packets for only the missing original data packets from the traffic source.

9. The method of claim 8, wherein the predetermined time period is calculated from a rate at which the original data packets are received by the traffic sink and an amount of remaining data of the original data packets.

10. The method of claim 8 wherein the receiving the fountain coded packets comprises receiving a subset of possible fountain coded packets.

11. The method of claim 10 wherein the subset is a minimum number of fountain coded packets necessary to decode all of the missing original data packets.

12. A network traffic source providing on-demand file repair, the network traffic source comprising:
    a processor; and
    a non-transitory computer readable storage medium storing programming for execution by the processor, the programming including instructions for:
       sending all of original data packets of a data file to a traffic sink without encoding any of the original data packets sent by the traffic source;
       sending to the traffic sink an indication that the sending of all of the original data packets is complete;
       receiving a request from the traffic sink for retransmission of missing original data packets of all the original data packets of the data file, the request comprising information related to the missing original data packets;
       after receiving the request, applying fountain coding to only the missing original data packets to generate fountain coded packets for the missing original data packets; and
       sending the fountain coded packets for the missing original data packets to the traffic sink.

13. The network traffic source of claim 12 wherein the sending the fountain coded packets comprises sending a subset of possible fountain coded packets.

14. The network traffic source of claim 13 wherein the subset is a minimum number of fountain coded packets necessary to decode all of the missing original data packets.

15. The method of claim 1, wherein the information related to the missing original data packets comprises packet numbers corresponding to the original data packets received by the traffic sink.

16. The method of claim 8, wherein the information related to the missing original data packets comprises packet numbers corresponding to the original data packets received by the traffic sink.

17. The network traffic source of claim 12, wherein the information related to the missing original data packets comprises packet numbers corresponding to the original data packets received by the traffic sink.

18. The network traffic source of claim 12, wherein the sending the fountain coded packets for the missing original data packets comprises sending the fountain coded packets of the missing original data packets until the traffic sink receives enough a subset of the fountain coded packets to decode the missing original data packets, a number of the subset of the fountain coded packets being less than a number of the missing original data packets.

19. The network traffic source of claim 18, wherein the request from the traffic sink for the retransmission of missing original data packets is a single control packet comprising a payload containing packet numbers of the missing original data packets.

20. The network traffic source of claim 19, wherein the packet numbers of the missing original data packets included in the payload are compressed.

21. The method of claim 1, wherein the receiving the request comprises receiving the request for retransmission of K missing original data packets from all the original data packets of the data file, the applying fountain coding requires a minimum N fountain coded packets of possible fountain coded packets, and the applying comprises:
    applying, by the traffic source, fountain coding to the K missing original data packets if K>N; and
    applying, by the traffic source, fountain coding to the K missing original data packets and (N-K) last packets fully received by the traffic sink if K N.

22. The method of claim 1, wherein the sending, by the traffic source, all of original data packets of the data file to the traffic sink without encoding any of the original data packets comprises sending each respective original data packet of the data file without receiving an acknowledgement of receipt of the respective original data packet from the traffic sink.

23. The method of claim 1, wherein the sending all of the original data packets comprises sending all of the original data packets without encoding information associated with any of the original data packets sent by the traffic source.

* * * * *